United States Patent [19]

Owczarz et al.

[11] Patent Number: 5,575,641
[45] Date of Patent: Nov. 19, 1996

[54] SEMICONDUCTOR PROCESSOR OPENING AND CLOSURE CONSTRUCTION

[75] Inventors: Aleksander Owczarz; Ronald J. Ray; Daniel L. Durado, all of Kalispell, Mont.

[73] Assignee: Semitool, Inc., Kalispell, Mont.

[21] Appl. No.: 509,704

[22] Filed: Jul. 31, 1995

Related U.S. Application Data

[60] Division of Ser. No. 86,771, Jun. 30, 1993, Pat. No. 5,449,289, which is a continuation-in-part of Ser. No. 901,613, Jun. 15, 1992, Pat. No. 5,302,120.

[51] Int. Cl.⁶ ............................................. F27D 3/00
[52] U.S. Cl. ............................ 432/9; 432/242; 432/250; 110/173 R
[58] Field of Search .................... 432/247, 253, 432/250, 242, 9; 110/173 R

[56] References Cited

U.S. PATENT DOCUMENTS

| | | | |
|---|---|---|---|
| 4,403,448 | 9/1983 | Lesher | 110/173 R |
| 4,427,378 | 1/1984 | Bowers | 432/250 |
| 4,883,002 | 11/1989 | Schuster | 432/250 |
| 5,193,998 | 3/1993 | Hack et al. | 432/250 |

*Primary Examiner*—Weilun Lo
*Attorney, Agent, or Firm*—Wells, St. John, Roberts, Gregory & Matkin, P.S.

[57] ABSTRACT

A semiconductor processor including an enclosure with an access opening. A door assembly is supported for translational movement between aligned and displaced positions relative to the access opening. The door assembly has a main part, and an extension part which telescopically moves toward and away from the access opening. A bellows is provided between the main and extension parts. The closed door is sealed by a first face seal and a second expandable seal. A liquids trap is provided to prevent outward escape of liquids from the access opening. A drain removes liquid collected in the trap.

33 Claims, 8 Drawing Sheets

SEMICONDUCTOR PROCESSOR OPENING AND CLOSURE CONSTRUCTION

CROSS-REFERENCE TO RELATED APPLICATION

This is a divisional application based on prior U.S. patent application Ser. No. 08/086,771 filed Jun. 30, 1993, now U.S. Pat. No 5,449,289, which was a continuation-in-part of prior U.S. patent application Ser. No. 07/901,613 filed Jun. 15, 1992, now U.S. Pat. No. 5,302,120 which is hereby incorporated entirely by reference.

TECHNICAL FIELD

The technical field of this invention is semiconductor processing equipment used to treat semiconductor substrates, wafers, photomasks, data disks, flat panel displays and other such units.

BACKGROUND OF THE INVENTION

The production of semiconductor substrates, wafers and photomasks has traditionally used processing equipment in which various types of processing fluids are used. One example of a semiconductor processor is a centrifugal rinser-dryer which uses water and dilute cleaning solutions. Other processors use acids, caustics, etchants, solvents and other processing fluids which are applied to the substrates, wafers, photomasks, data disks, flat panel displays and other semiconductor-related units.

A constant challenge in the production of semiconductors is particle contamination. With respect to all types of semiconductor processors, preventing contaminant particles from entering into the processor enclosure is of paramount importance. Such particles can affect the photographic processes used to transfer the chip layouts onto the wafers being processed into chips, and can further cause deterioration of the image being transferred onto the wafer. Even more susceptible to contamination is the direct processing of the wafers because of the numerous processing steps that take place. With each step there is a risk that contaminating particles may adhere to the surface of the wafer. Once contaminant particles are transferred onto the surface of the wafer, they are often difficult to remove.

One of the greatest sources of contaminating particles is the presence of environmental dust carried in the air surrounding the semiconductor processors. To reduce the amount of environmental contamination, manufacturers have taken extreme measures to provide working areas with relatively low amounts of environmental dust. These areas are called "clean rooms". Such working areas are expensive to build and operate. Hence, there is a substantial need to provide semiconductor processing equipment that minimizes the risk of contamination.

Another problem associated with traditional semiconductor processors relates to toxic and corrosive processing fluids, such as acids, caustics, solvents and other processing fluids. Such processing fluids must be maintained within the processing chamber to avoid corrosion and other harmful effects to personnel and materials outside of the semiconductor processor enclosure. Of concern are both liquid and gaseous forms of processing fluids, both of which should be prevented from exiting the processor enclosure and contacting machine parts susceptible to corrosion.

Processing fluids are preferably contained within the enclosure both during processing and when access into the processing chamber is needed. A common problem arises with respect to leakage of processing fluids around the area where the processor door seals against the processor bowl or other processing enclosure. For example, processing within a centrifugal processor having a horizontal or inclined axis of rotation and upstanding front access opening will result in liquids collecting along the walls of the access opening port. These collected liquids tend to run down along the walls and can collect near the bottom of the opening part. When the door is opened the collected liquids drip, flow or otherwise escape outwardly from the access opening to the exterior of the processing enclosure and down along the front panel of the processor. These fluids may even reach the floor around the processing enclosure. This leakage also creates undesirable working conditions. In addition, corrosive processing fluids may cause injury or damage to the equipment or building. Thus, there exists a need to provide semiconductor processing equipment having an improved door construction which prevents processing fluids from escaping and causing undesirable effects.

Various attempts have been made to provide doors for semiconductor processing equipment that will adequately seat the access opening to prevent contaminant particles from entering and prevent processing fluids and vapors from escaping. However, because of the need to precisely align the door with the enclosure access opening, traditional equipment has required substantial in-field adjustments to ensure that the door seals properly within the access opening. Maintaining adjustment of such doors has involved excessive amounts of time and labor. Furthermore, because of the many mechanical working parts required for the adjustments, the risk of mechanical failure of the doors has been high.

There remains a substantial need for semiconductor processing equipment which is easy to install and service in the field and minimally susceptible to mechanical failure. There is also a substantial need to provide semiconductor processing equipment that minimizes leakage of processing fluids and prevents contaminating particles from passing to the interior of the processing chamber. The present invention provides substantial and surprising benefits with respect to these needs.

BRIEF DESCRIPTION OF THE DRAWINGS

One or more preferred forms of the invention are described herein with reference to the accompanying drawings. The drawings are briefly described below.

DETAILED DESCRIPTION OF THE PREFERRED EMBODIMENTS

Figure 1:
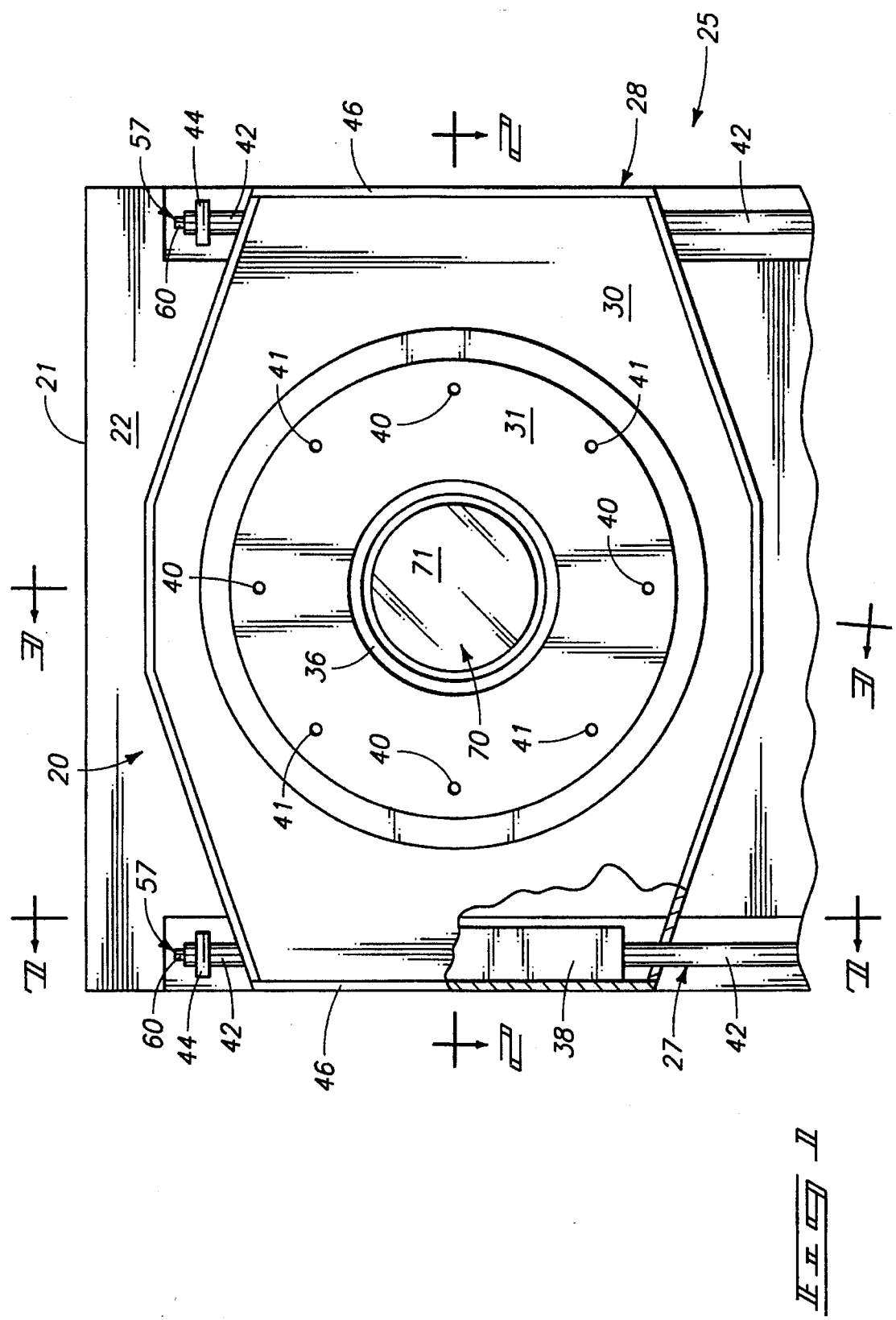
FIG. 1 is a partial front elevational view of a preferred semiconductor processor having a preferred opening and closure construction made according to the present invention. One portion is broken away and shown in section to reveal internal components.

This disclosure of the invention is submitted in furtherance of the constitutional purposes of the U.S. Patent Laws "to promote the progress of science and useful arts" (Article 1, Section 8).

The present invention is a semiconductor processor opening and closure construction. The construction includes a door assembly 20 adapted to be used in conjunction with a semiconductor processor 21 (not fully illustrated). Processor 21 has a processing enclosure or bowl 22. The bowl is connected to a frame 23. Frame 23 supports a front housing panel 24. The processing bowl or processing enclosure 22 defines a processing chamber 19 which is substantially enclosed therewithin when the door assembly is in a closed position. The processing chamber 19 receives the semiconductor units which are to be processed by processor 21. Other parts of the processor not pertinent to the novel opening and closure construction of this invention are not illustrated or described and can be constructed in a variety of configurations.

The semiconductor processor is most preferably a centrifugal machine, such as a centrifugal rinser-dryer, solvent processor or acid processor. Such a semiconductor processor is capable of processing one or more semiconductor substrates, wafers, photomasks, data disks, flat panel displays or other semiconductor-related units which are sensitive to contamination from even very small particles (e.g., equal to or larger than 0.1–0.2 micron). Some of the materials which can be processed in a typical semiconductor processor include silicon units, gallium arsenide units, indium phosphide units, glass units, ceramic units, solar cells, memory disks, flat panel displays, and other semiconductor-related units. A variety of processing fluids are used in various processing steps and can include various types of acids, caustics, etchants, solvents and other rinsing, cleaning or processing solutions.

The door assembly 20 is mounted to the semiconductor processor frame 23 via the front panel 24 thereof. The door assembly 20 includes a door support 25. The door support has two basic subdivisions which are a door support stationary subassembly 27 and a door support movable subassembly 28. The stationary subassembly is mounted to the frame and is in a fixed position during operation. The movable subassembly moves with respect to the stationary subassembly and other stationary parts of the processor.

The movable door subassembly includes a main door support piece 30. The main door support piece 30 is movable relative to the enclosure and serves as the primary structure to which various components of the door assembly 20 are mounted. A processor access opening rim 50 (FIGS. 2–6) extends about the processing bowl access opening 26 to form an outer lip for the processing enclosure. Rim 50 is preferably directly connected to processing bowl 22, such as by welding to the front wall thereof.

Processing chamber rim 50 defines access opening 26. Access opening 26 is the main access opening to the processing chamber and the opening through which semiconductor units are installed into and removed from the processor bowl. Rim 50 defines an outer face 51 which is a substantially planar surface that provides the outer front surface of the processor enclosure 22. Outer face 51 forms a frontal abutment surface against which the processor door assembly 20 stops when extended (see FIGS. 4 and 6).

The main door support piece 30 mounts a door 70 and a door extension and retraction operator 29. Door 70 is extendible and retractable by operator 29. The door extension and retraction operator includes a first or main piece 32 and a second operative or extension piece 34. Main piece 32 is mounted to an annular mount piece 35 and an outer door face piece 31 using fasteners 41 (see FIGS. 1 and 3) which extend through the outer face piece 31, main piece 32 and into threaded receptacles formed in the annular mount piece 35. Fasteners 40 extend through the face piece 31 and are threadably received in receptacles formed in the main piece 32. Fasteners 40 are located at different angular positions about the face from fasteners Extension piece 34 is positioned inside of the main piece 32 for controllable extension and retraction relative to the main piece and other non-extendible parts of the door assembly. The extension piece is concentrically and telescopically positioned within the main piece for slidable relative movement thereto in either extension or retraction modes of movement. Additional features and the operation of the extension piece and main piece are discussed in greater detail below.

The door assembly face piece 31 preferably includes a viewing aperture 36 which is open and through which an operator can see door 70. Door 70 is provided with a window panel 71 which is transparent and through which an operator can view processing occurring within the processing chamber. The door face is coupled to the main piece at mounting points 40 by means of conventional fasteners. The door face provides a base for supporting the movable extension piece 34.

Figure 2:
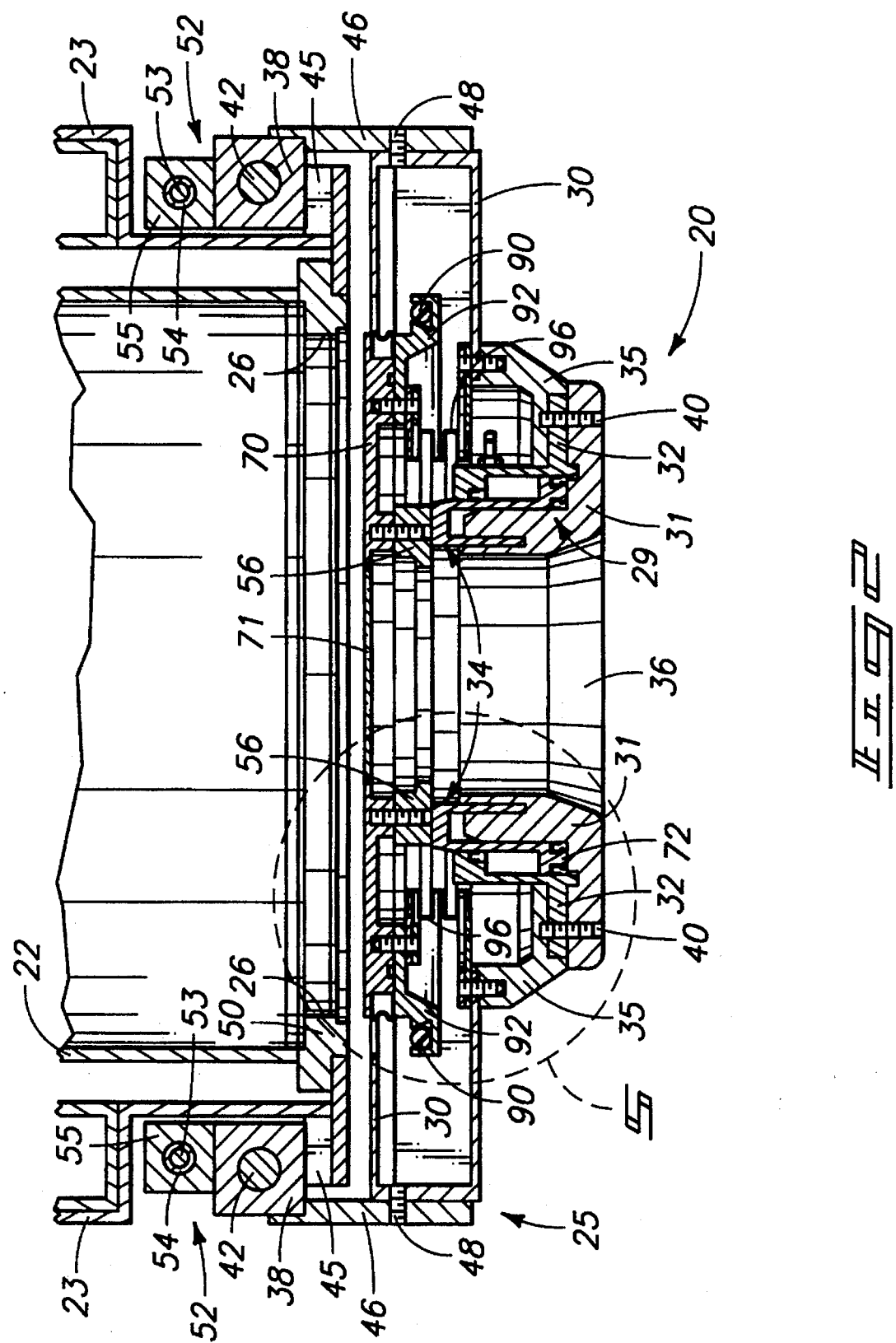
FIG. 2 is a sectional view, taken along the line 2—2 of FIG. 1.

Door support 25 is constructed to provide adjustable positioning of door assembly 20 relative to the access opening 26 of the processing bowl. The door support includes means for guiding and moving the door assembly into an aligned position with the access opening, such as shown in FIG. 2. It also includes means for removing the door assembly into displaced positions wherein the door assembly is displaced to allow manual or automated access through the access opening. In the preferred embodiment shown the door support includes a door positioning or alignment operating mechanism which advantageously provides for translational movement of the door assembly and moving portions of the door support.

Figure 7:
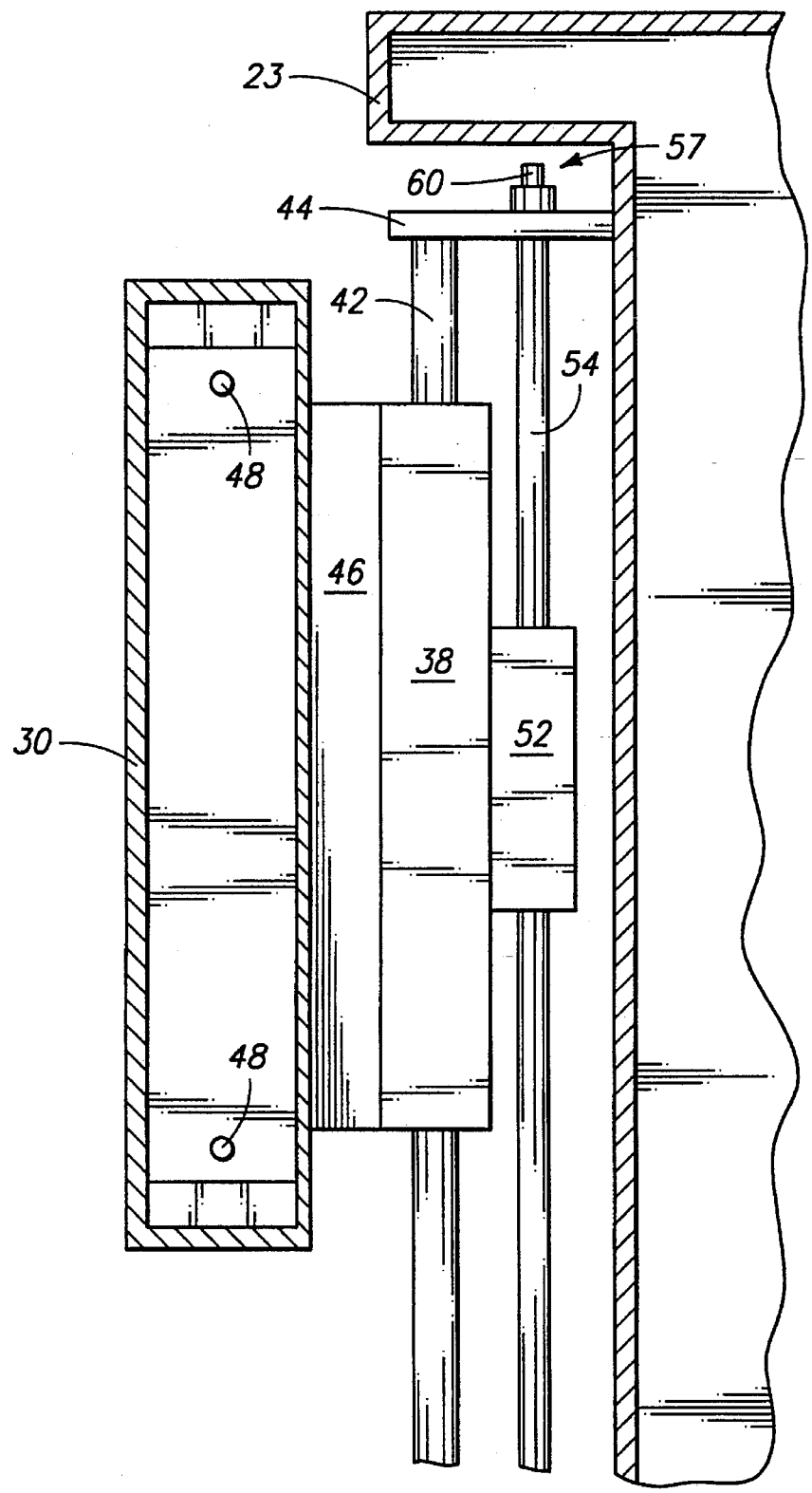
FIG. 7 is a sectional view, taken along the line 7—7 of FIG. 1.

FIGS. 1, 2 and 7 show a preferred manner in which the door alignment operating mechanism can be implemented. As shown, it includes a door support front panel or main piece 30 which is coupled along each side to side panels 46. Each side panel is connected to a slidable guide follower in the form of a sliding bushing 38. The sliding bushings 38 have cylindrical passageways which encircle stationary, cylindrical guide rods 42. This construction allows controlled movement of the door support plate 30 and other parts of the door assembly and movable subassembly of the door support. The guide rods 42 are mounted to the frame 23 by means of an upper mounting bracket and a similar lower mounting bracket 45 (see FIG. 2).

The sliding guide bushings 38 maintain the door assembly 20 in a properly oriented position relative to the processing bowl access opening 26. The bushings slide upon guide rods 42 to thereby provide guided translational movement in a plane spaced from, and most preferably substantially parallel with, the plane defined by the front surface 51 of the processing bowl rim 50. As shown, the guided translational movement is upwardly and downwardly relative to other parts of processor 21 in a vertical plane or alternatively, in a slightly inclined plane. When inclined the plane tips rearwardly at the top with frontal projections of the guide rods still appearing vertical. Other configurations are also possible.

The preferred door alignment operating mechanism of door support 25 also includes one or more door alignment positioning operators or actuators 52. Door alignment positioning operator 52 is connected to the movable door support subassembly. This is advantageously accomplished by using two such operators which are connected to the slidable guide bushings 38 in any suitable manner, such as by conventional fasteners (not shown). Each alignment positioning operator 52 encircles an actuator tube 54 and is controllably moved relative thereto. Actuator tubes 54 are mounted adjacent to and in parallel orientation with guide rods 42. Actuator tubes 54 extend between and are supported by the upper and lower door support mounting brackets 44 and 45.

FIG. 2 alignment positioning operators 52 each include a permanent actuator magnet 53 which moves within tube 54. The positioning operator follower 55 is also magnetic or provided with a magnet therein. Motion of the slidable actuator magnets 53 contained in tubes 54 (see FIG. 2) causes a corresponding movement of the follower 55. The actuator magnets 53 are moved within tubes 54 in a suitable manner, such as by applying pneumatic pressure in a controlled manner to opposing ends of tube 54. The actuator magnets piston 53 are moved along the inside of actuator tube 54 by increasing or decreasing fluid pressure into the actuator tubes 54 via an upper inlet end 57 (FIG. 7) or a lower inlet end (not shown). Each end of the actuator tube 54 is advantageously provided with a pressurized fluid fitting 60 (only one shown) which is connected to a pneumatic line to provide actuating gas or other fluid pressure at the ends of the tube 54. Upon creating a differential pressure across on the actuator magnets or pistons 53, the combination of the follower 55 and guide bushing 38 will move up or down along the guide rods 42 to move the door assembly 20 along guide rods 42 and relative to access opening 26.

In a preferred embodiment, the parallel relationship and vertical orientation of the guide rods 42 allow for vertical movement of the movable door support subassembly and door assembly supported thereby. The moving door and door support assembly is capable of vertical movement between an open or fully displaced position to allow access into the bowl of the processor enclosure, and an aligned position whereby the door assembly 20 is in substantially concentric alignment with the access opening 26 (FIG. 1). In the aligned position the door can be extended into the access opening 26 and sealed against the rim 50 of the processor bowl.

FIGS. 2–6 show sectional views which illustrate the specifics of the preferred door assembly 20. The door assembly includes a non-extendible part and an extendible part. The extendible part extends in a direction transverse to the plane in which the door support movable sub-assembly moves upon guide bars 42. Most preferably, extension is perpendicular to the plane of movement of the door support.

The non-extendible part includes the door main or first piece 32, the door outer face piece 31, the annular mounting piece 35 and associated fasteners. The extendible or extension part includes the extension piece 34, connected door 70 and related parts described in greater detail hereinafter. The door support plate 30 provides the primary support piece for the non-extendible and extendable portions of door assembly 20.

Door assembly 20 includes the axial extension and retraction operator 29. Door 70 is extendible into the access opening 26 using such operator. The door extension-retraction operator includes annular extension part 34. The sectional views in FIGS. 5 and 6 indicate that the extension part 34 has an annular guide receptacle 69. The guide receptacle is formed by a U-shaped portion 68.

An annular tongue 91 is formed by inward portions of the door face piece 31 which are radially outward from annular guide slot 37. Extension piece 34 also includes an annular piston portion 72. Piston portion 72 is formed as a flange which extends outwardly opposite U-shaped portion 68. The annular piston portion 72 rides within an annular piston operation chamber 75 (FIG. 6) defined by the door face piece 31 and the main piece 32. The inward annular fin 73 opposite piston 72 rides in the annular slot 37 and acts like a combined guide and shield.

A spacer ring 56 mounts between the face or apex of the U-shaped portion 68 and door 70 by conventional fasteners or adhesives. The door preferably includes window 71 which is transparent to thus allow viewing by an operator of the semiconductor processor to monitor processing within the processor bowl.

Piston 72 bifurcates the annular piston operation chamber 75 into two compartments: a retraction chamber compartment 76 and an extension chamber compartment 74. Each piston chamber compartment is adapted to hold pneumatic or hydraulic fluid. Multiple annular seals 80 are positioned about the piston portion 72 and the extension piece 34 to seal and separate fluid within chambers 74 and 76.

Figure 6:
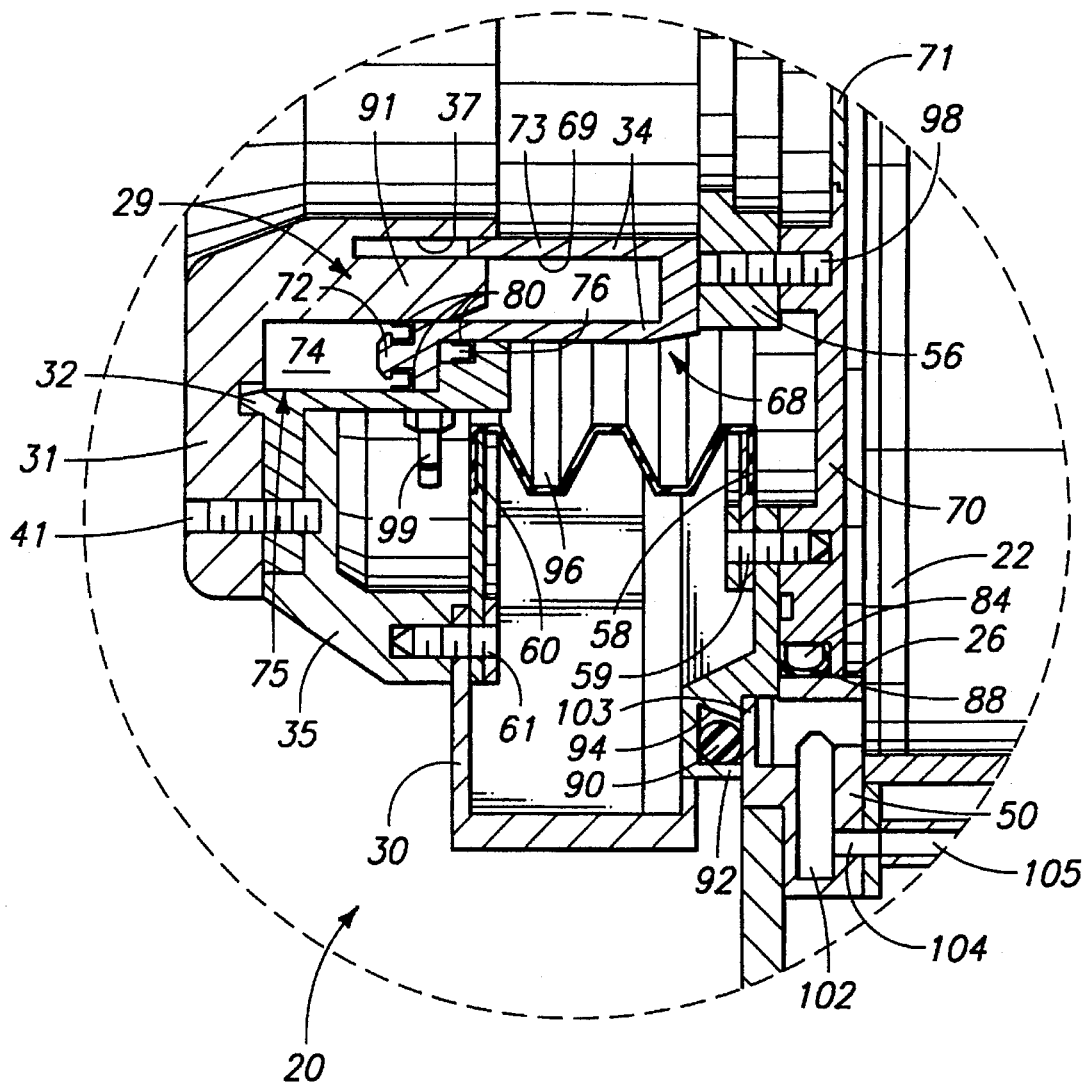
FIG. 6 is an enlarged partial sectional view, showing the area within circle 6 of FIG. 4.

FIG. 6 shows that a fluid supply fitting 99 is provided in fluid communication with retraction chamber 76 to increase or decrease fluid pressure within the chamber and effectuate movement of the piston portion 72. Although not shown, a similar supply conduit may be provided to the extension chamber 74 to likewise increase or decrease fluid pressure within the chamber and effectuate movement of the piston piece. For example, when pneumatic fluid is supplied under an increased pressure to the extension chamber 74, a pressure differential is created on the piston 72 which will cause the extension piece 34 to extend away from the door face 31. A primary advantage of the present invention is that the piston 72 causes the extension piece 34 to extend from the door face 31 equidistantly at all times and requires no peripheral adjustments to ensure equidistant movement.

FIGS. 3–6 show the door assembly fitted with a flexible annular shroud in the form of a bellows cover 96. Bellows cover 96 has an extension flange 116 which moves with the extendible portions of the door assembly. Bellows 96 also has a non-extending flange 117 is held by an annular bellows retainer 118 which is held by fastener 61 to the door support main piece 30 and annular mounting piece 35. A similar annular mounting ring 119 is used with the extension flange of the bellows. Ring 119 is connected to the door 70 using fasteners 59. The bellows cover allows for full axial extension and retraction of the door 70 while preventing foreign objects and human operator fingers from contacting the extension and retraction operator 29. The bellows cover also serves to impede contaminant particles.

Figure 4:
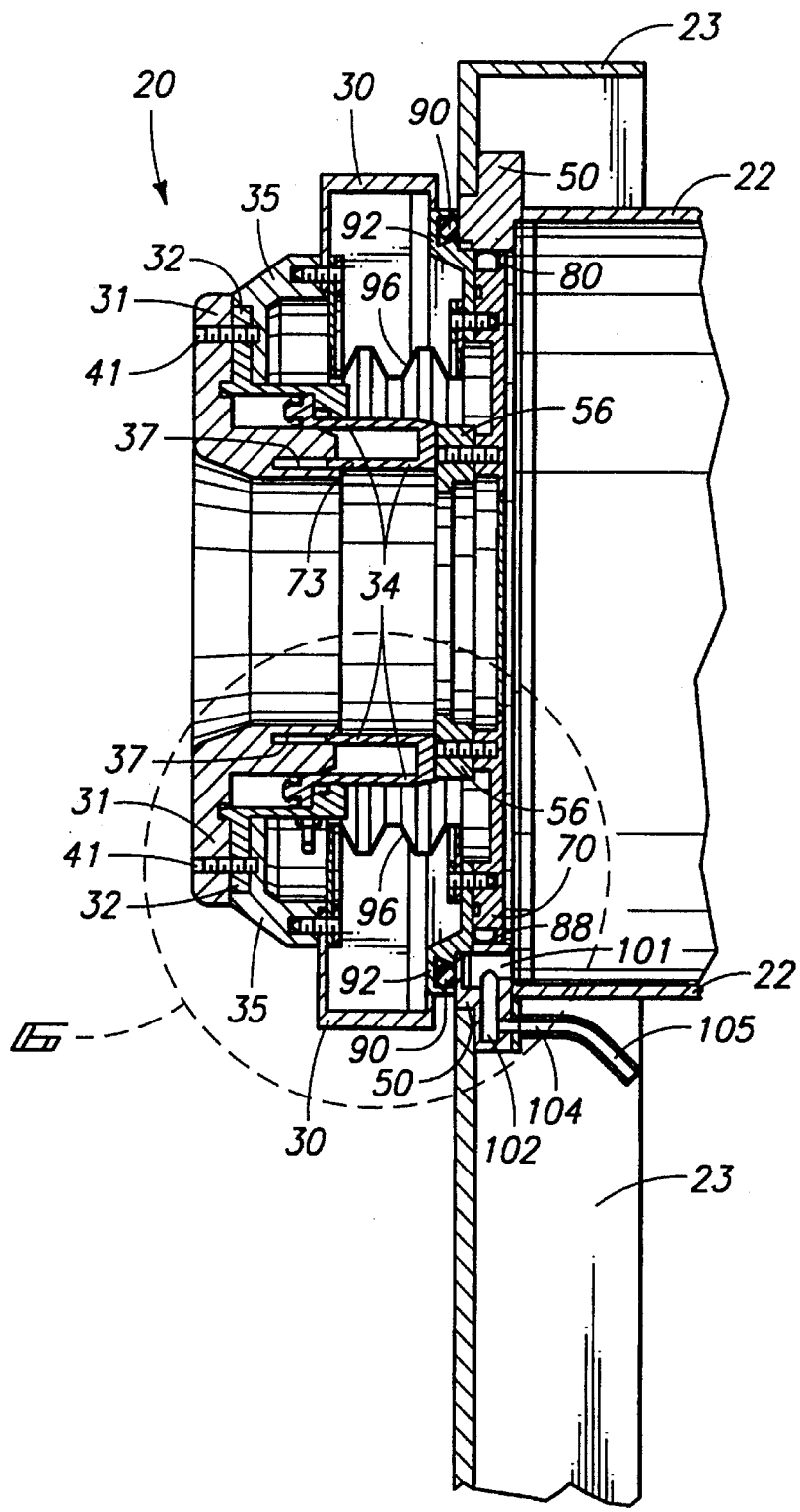
FIG. 4 is a sectional view similar to FIG. 3 showing the extendable door in an extended position engaged with the processing enclosure.
Figure 5:
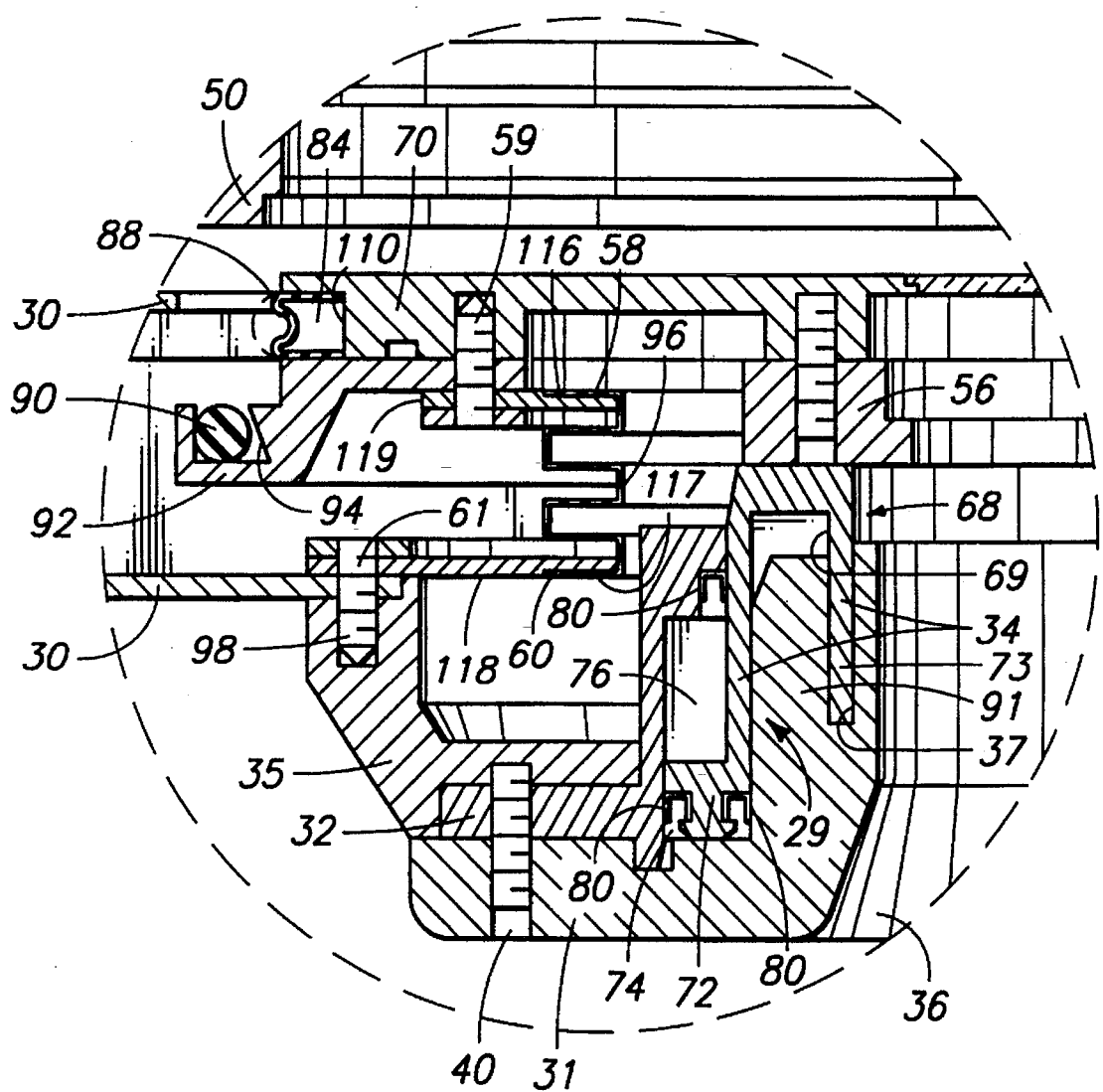
FIG. 5 is an enlarged partial sectional view, showing the area within circle 5 of FIG. 2.

FIG. 4 and enlarged FIG. 6 show the extension member 34 and integral piston piece 72 in an extended position. This position occurs when fluid pressure increases in extension chamber 74. FIG. 2 and enlarged FIG. 5 depict the extension member 34 and piston piece 72 in a retracted position. Increased fluid pressure in retraction chamber 76 causes the piston and extension piece to retract from the extended position.

FIGS. 5 and 6 show that the preferred door assembly construction includes a first seal 90 and a second seal 88. First seal 90 is an annular face seal which is positioned within a groove or slot 94 formed in a seal housing piece 92. Housing piece 92 is mounted to the back face of the door 70 using fasteners 59.

FIG. 6 shows door 70 extended into an extended position in contact with the access opening 26 formed by rim 50 of the processor bowl. In this extended position, the contact face of seal housing 92 abuts the outward face 51 of rim 50 adjacent the access opening. The face seal 90 is compressed between the seal housing and the rim face to form a substantially liquid-tight seal. The face seal creates a first seal between the door 70 and the rim of the processor enclosure to impede or prevent processing fluids from escaping outwardly from the processing chamber.

FIGS. 5 and 6 also show the preferred construction of the second seal 88. Second seal 88 is positioned inwardly from first seal 92. The first and second seals are spaced to confine an area between them which is herein termed an access opening closure isolation area. Second seal 88 is preferably a seal which seals between the outer periphery of door 70 and an internal surface formed along the inside wall of access opening 26. This is accomplished by having a seal which is retractable or compressible in a radial direction relative to the centerline of the access opening and door. As shown, the second seal includes a seal member 88 which is received and held within a groove 110. Groove 110 is advantageously formed between the door 70 and the annular seal housing piece 92.

Second seal 88 is preferably a controllably seal which can be expanded and contracted. This is advantageously accomplished by supplying or removing air or other fluid pressure to the interior of seal 88. During the process of extending door 70 the second seal is deflated and retracted and the door is extended into a closed position such as shown in FIG. 6. Upon closure of the door, pressurized fluid is supplied to the interior of seal 88 and the seal is inflated and expands outwardly to produce a fluid-tight seal along the interior walls of the access opening, such as defined by rim 50. Second seal 88 thus provides a controllable peripheral seal at the periphery of door 70.

Figure 3:
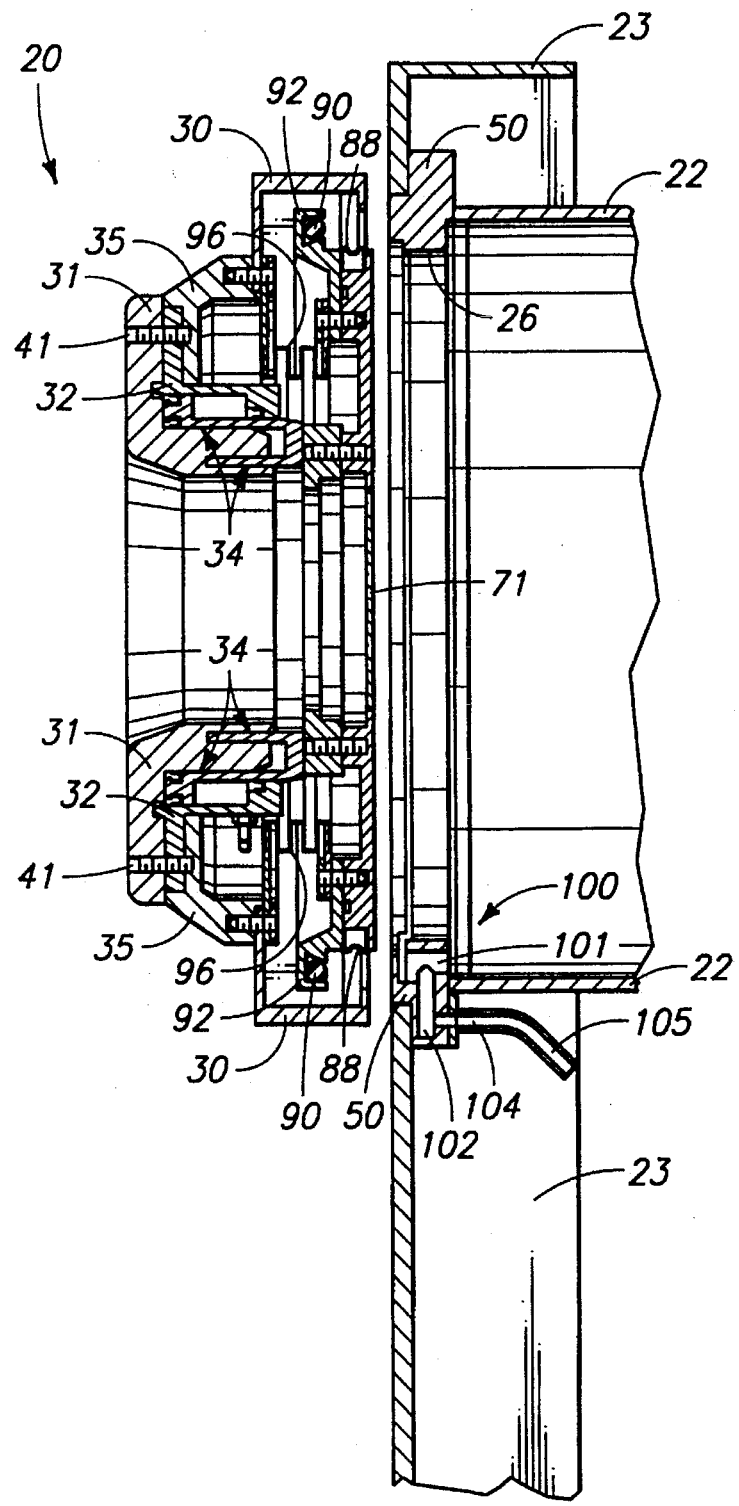
FIG. 3 is a sectional view, taken along the line 3—3 of FIG. 1. The extendable door is shown in a retracted position spaced from the processing enclosure.

The preferred processor 21 built according to this invention further includes a liquids trap to prevent or impede outward escape of draining liquids from the access opening. Such escape is often manifested by dripping or draining of liquids which collect along the access port wall, despite the limited depth of the access port wall. FIGS. 3 and 4 show the principal features of the preferred liquids trap 100. As shown, liquids trap 100 is advantageously incorporated as features of the access opening rim 50.

Figure 8:
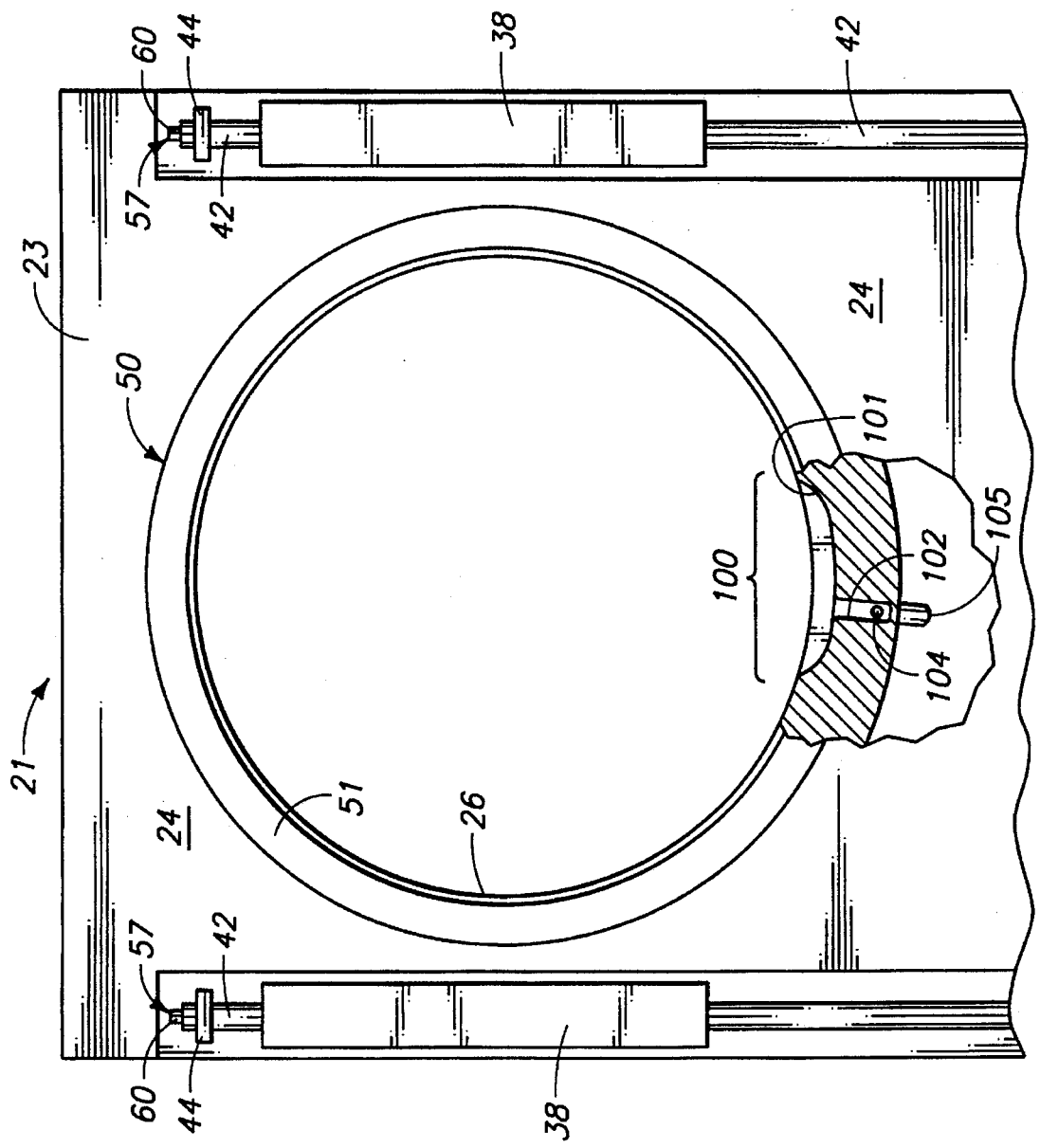
FIG. 8 is a front view showing in isolation the access port and associated features which provide a liquids trap included in the processor of FIG. 1.

Liquids trap 100 includes a trough or trench 101 which extends outwardly and upwardly along the wall of access port 26 from a bottom center position (see FIG. 8). The trough is recessed downwardly relative to other surfaces of the rim. This recessed construction provides a frontal lip 103 (see FIG. 6). Frontal lip 103 extends inward toward the central axis of access opening 26, and is but adjacent to the outer face 51 of rim 50. This trough and lip combination retains liquids and directs them to a reservoir 102 provided at or near the bottom of the trough. Reservoir 102 is advantageously provided with a drain or outflow 104. The drain has an associated drain line 105, which is preferably connected to a vacuum aspiration line to provide a suction to the drain and liquids trap. This enhances the effectiveness of the liquids trap and further impedes or prevents escape of draining liquids outwardly from the access port opening. An advantage of the liquids trap 100 is that processing fluids are prevented from running down the face of the processing enclosure and onto the floor adjacent the processor when opening and accessing the processing chamber.

The semiconductor processor opening and closure construction described herein is made using known machining and forming techniques to produce the components and assemblies described and shown herein. The specific materials of construction vary, dependent upon the type of chemicals used in the processor. In general the components are made from metals suitable for the processing environment in which the machine is to be used. Door 70 can advantageously be constructed of metal or plastic and provided with a glass or transparent plastic window 71.

The invention further includes novel methods which will now be described in connection with additional description of the operation of the processor 21. The methods include aligning the door with the access opening. This is preferably accomplished by moving or repositioning the movable subassembly of the door support and the door assembly supported thereon. The door assembly is preferably repositioned by moving the door in a plane which is spaced from and advantageously parallel to the plane defined by the access opening rim 50. The movement of the door assembly is preferably performed by translational movement such as by sliding the movable part of the door support and door assembly upon the guide rods 42 using the door positioning operators 52. The moving of the door support and door assembly is most preferably done by guiding each side of the door support during actuating using the fluid powered magnetically coupled operators 52.

The novel methods further include extending the extendible part of the door assembly. This is done by actuating the extension-retraction operator 29 to effect an extensionary mode of action. More specifically, the extending step is accomplished by pressurizing the annular extension chamber 74 adjacent to the annular piston 72. This causes the extendible part to move toward the processing enclosure access opening 26. Extension movement is preferably along a line of action in the same direction as the centerline axis of the door. The door 70 is extended into the access opening. The extending step is preferably limited by stopping extension of the door assembly when the face seal 90 or seal housing 92 contacts the rim outer face 51.

The methods further include forming a first seal between the door and processing enclosure about the access opening. This first seal is advantageously formed along a first line of sealing by compressing the face seal 90 against face 51. The methods also advantageously include forming a second seal between the door and processing enclosure. The second seal is preferably formed along a second line of sealing which is in spaced relationship to the first line of sealing of the first seal to substantially confine an access opening closure isolation area or space therebetween adjacent the access opening. The second seal is most preferably formed by positioning an expandable seal 88 within the access opening 76 and then expanding the expandable seal to effect a fluid-tight seal.

After the seals are formed the confined area can advantageously be drained through drain 100. Even more preferably the draining action can be complemented by aspirating the drain using a vacuum applied through the outflow or drain line 105. This reduces the pressure in the confined space between the seals and further helps to prevent leakage from the access opening during any processing operation and when the door 70 is retracted.

The preferred methods also preferably include retracting the door. This is preceded by deflating the expandable second seal 88 in preparation for retraction of the door. The desired methods still further incorporate trapping any liquid draining which may occur due to liquids or condensates being formed upon the wall of the access opening. The trapping is performed when liquids move downwardly under the force of gravity along the access opening wall. The liquid flow into trough 101 traps the liquid within the trough and reservoir 102. The lip 103 dams the front of the trough and diverts the flow of liquids into the trough.

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

We claim:

1. A method for operating a semiconductor processor having an access opening through which access is provided into a processing enclosure, and a door which is adapted for closing the access opening; comprising:

aligning the door with the access opening by repositioning the door relative to the access opening;

extending an extendible portion of the door relative to a main part of the door to occlude the access opening;

forming a first seal between the extendible portion of the door and the processing enclosure within or adjacent to the access opening;

forming a second seal between the extendible portion of the door and the processing enclosure within or adjacent to the access opening, said first and second seals being spaced confining a closure isolation area between the first and second seals within or adjacent the access opening to prevent fluids escape from the access opening.

2. A method according to claim 1 and further comprising:

retracting the extendible portion of the door from the access opening;

trapping liquid drainage within the closure isolation area to prevent escape of liquid drainage therefrom.

3. A method according to claim 1 and further defined by:

said forming a first seal being accomplished by forming a face seal about the access opening;

said forming a second seal being accomplished by expanding a seal within the access opening.

4. A method according to claim 1 and further defined by said aligning the door being accomplished by moving the door in a plane spaced from a plane defined by the access opening.

5. A method according to claim 1 and further defined by said aligning the door being accomplished by moving the door in a plane spaced from and substantially parallel to a plane defined by the access opening.

6. A method according to claim 1 and further comprising:

retracting the door from the access opening;

trapping liquid drainage from within the access opening to prevent escape of liquid drainage therefrom.

7. A method according to claim 1 and further comprising:

retracting extendible portion of the door from the access opening;

trapping liquid drainage within the closure isolation area to prevent escape of liquid drainage therefrom;

aspirating from between the first and second seals to help prevent escape of liquid drainage from the access opening.

8. A method according to claim 1 and further comprising aspirating from between the first and second seals to prevent escape of liquid drainage from the access opening.

9. A method according to claim 1 and further comprising draining from between the first and second seals to prevent escape of liquid drainage from the access opening.

10. A method according to claim 1 and further defined by:

said forming a first seal being accomplished by forming a face seal about the access opening;

said forming a second seal being accomplished by expanding a seal within the access opening;

retracting the door from the access opening;

trapping liquid drainage within the closure isolation area to prevent escape of liquid drainage therefrom;

draining from between the first and second seals to help prevent escape of liquid drainage from the access opening.

11. A method according to claim 1 wherein the aligning is at least partially accomplished using guided translational movement.

12. A method according to claim 1 and further comprising retracting the extendible portion of the door from the access opening.

13. A method according to claim 1 and further comprising trapping liquid drainage within the access opening to prevent escape of liquid drainage therefrom.

14. A method according to claim 1 and further comprising aspirating from between the first and second seals to remove fluids from the access opening closure isolation area.

15. A method for operating a semiconductor processor having an access opening through which access is provided into a processing enclosure, and a door which is adapted for closing the access opening; comprising:

positioning a door against a processing enclosure adjacent an access opening to occlude the access opening;

forming at least one seal between the door and the processing enclosure within or adjacent to the access opening;

draining liquids which collect along the access opening into a drain forming a part of the semiconductor processor.

16. A method according to claim 15 wherein said forming at least one seal includes expanding a seal into engagement with the processing enclosure.

17. A method according to claim 15 wherein said forming at least one seal includes engaging a face seal into engagement with the processing enclosure.

18. A method according to claim 15 wherein said forming at least one seal includes forming at least a first seal and a second seal.

19. A method according to claim 15 wherein said forming at least one seal comprises:

forming at least one first seal which is a face seal about the access opening;

forming at least one second seal which is within at least part of the access opening.

20. A method according to claim 15 wherein said forming at least one seal comprises:

forming at least one first seal which is a face seal about the access opening;

forming at least one second seal by expanding a second seal within at least part of the access opening.

21. A method according to claim 15 and further comprising aspirating to enhance draining from the drain.

22. A method according to claim 15 wherein said draining is from between first and second seals.

23. A method for operating a semiconductor processor having an access opening through which access is provided into a processing enclosure, and a door which is adapted for closing the access opening; comprising:

positioning a door against a processing enclosure adjacent an access opening to occlude the access opening;

forming at least one seal between the door and the processing enclosure within or adjacent to the access opening;

trapping liquids which collect near the access opening using a part of the semiconductor processor.

24. A method according to claim 23 wherein said trapping includes damming liquids along a lip.

25. A method according to claim 23 wherein said trapping includes flowing liquids into a trough formed adjacent the access opening.

26. A method according to claim 23 wherein said trapping includes:

damming liquids along a lip;

flowing liquids into a trough formed adjacent the access opening and said lip.

27. A method according to claim 23 wherein said forming at least one seal includes expanding a seal into engagement with the processing enclosure.

28. A method according to claim 23 wherein said forming at least one seal includes engaging a face seal into engagement with the processing enclosure.

29. A method according to claim 23 wherein said forming at least one seal includes forming at least a first seal and a second seal.

30. A method according to claim 23 wherein said forming at least one seal comprises:

forming at least one first seal which is a face seal about the access opening;

forming at least one second seal which is within at least part of the access opening.

31. A method according to claim 23 wherein said forming at least one seal comprises:

forming at least one first seal which is a face seal about the access opening;

forming at least one second seal by expanding a second seal within at least part of the access opening.

32. A method according to claim 23 and further comprising aspirating to enhance draining from the drain.

33. A method according to claim 23 wherein said draining is from between first and second seals.

* * * * *